(12) United States Patent
Storm et al.

(10) Patent No.: US 9,887,349 B2
(45) Date of Patent: Feb. 6, 2018

(54) COATING METHOD, SURFACE LAYER STRUCTURE, AS WELL AS APPLICATIONS

(71) Applicant: Airbus Defence and Space GmbH, Ottobrunn (DE)

(72) Inventors: Stefan Storm, Unterschleißheim (DE); Erhard Brandl, Eitensheim (DE); Dominik Raps, Munich (DE)

(73) Assignee: AIRBUS DEFENCE AND SPACE GMBH, Ottobrunn (DE)

( * ) Notice: Subject to any disclaimer, the term of this patent is extended or adjusted under 35 U.S.C. 154(b) by 407 days.

(21) Appl. No.: 14/388,708

(22) PCT Filed: Mar. 12, 2013

(86) PCT No.: PCT/EP2013/054936
§ 371 (c)(1),
(2) Date: Sep. 26, 2014

(87) PCT Pub. No.: WO2013/143834
PCT Pub. Date: Oct. 3, 2013

(65) Prior Publication Data
US 2015/0050514 A1 Feb. 19, 2015

(30) Foreign Application Priority Data

Mar. 28, 2012 (DE) .................. 10 2012 102 690

(51) Int. Cl.
*B05D 5/00* (2006.01)
*H01L 41/331* (2013.01)
(Continued)

(52) U.S. Cl.
CPC .......... *H01L 41/331* (2013.01); *B29C 43/203* (2013.01); *B32B 15/01* (2013.01);
(Continued)

(58) Field of Classification Search
CPC .......................... H01L 41/331; H01L 41/333
See application file for complete search history.

(56) References Cited

U.S. PATENT DOCUMENTS 3,774,428 A 11/1973 Derry et al.
4,722,855 A 2/1988 Bauchhenss
(Continued)

FOREIGN PATENT DOCUMENTS

DE 198 03 787 A1 8/1999
DE 199 15 014 A1 10/1999
(Continued)

OTHER PUBLICATIONS

The German Office Action for the corresponding German patent application No. 10 2012 102 690.4, dated Oct. 17, 2014.
(Continued)

*Primary Examiner* — Xiao S Zhao
(74) *Attorney, Agent, or Firm* — Global IP Counselors, LLP

(57) ABSTRACT

A coating method for producing a function layer on mechanically loaded components or surfaces includes providing or applying a first material layer of a first material or substrate matrix having a mechanical flexibility higher than that of a second material on a substrate constituting the component or the surface, respectively, structuring the first material layer such that the material layer surface of the first material layer, which is opposite to the substrate, obtains a three-dimensionally molded basic structure with projections and recesses, and coating the material layer surface of the first material layer with a second material layer of the second material in such a way that the second material layer adopts substantially the basic structure of the material layer surface with the projections and recesses. Also, surface layer structures can be produced by this method.

15 Claims, 8 Drawing Sheets

(51) Int. Cl.
*C23C 4/06* (2016.01)
*C21D 10/00* (2006.01)
*C23C 14/02* (2006.01)
*C23C 14/14* (2006.01)
*H01L 41/083* (2006.01)
*H01L 41/053* (2006.01)
*H01L 41/23* (2013.01)
*C23C 24/04* (2006.01)
*B29C 43/20* (2006.01)
*H01L 41/333* (2013.01)
*C23C 4/01* (2016.01)
*B32B 15/01* (2006.01)
*B29L 9/00* (2006.01)

(52) U.S. Cl.
CPC .............. *C21D 10/005* (2013.01); *C23C 4/01* (2016.01); *C23C 4/06* (2013.01); *C23C 14/024* (2013.01); *C23C 14/028* (2013.01); *C23C 14/14* (2013.01); *C23C 24/04* (2013.01); *H01L 41/0533* (2013.01); *H01L 41/083* (2013.01); *H01L 41/23* (2013.01); *H01L 41/333* (2013.01); *B29L 2009/005* (2013.01); *Y10T 428/12389* (2015.01); *Y10T 428/24521* (2015.01); *Y10T 428/24545* (2015.01)

(56) References Cited

U.S. PATENT DOCUMENTS

| | | | |
|---|---|---|---|
| 5,593,739 | A | 1/1997 | Kickelhain |
| 6,228,427 | B1 | 5/2001 | Wanger |
| 7,318,844 | B2 | 1/2008 | Kessler et al. |
| 2003/0234835 | A1* | 12/2003 | Torii .................. B41J 2/14233 |
| | | | 347/68 |

FOREIGN PATENT DOCUMENTS

| | | |
|---|---|---|
| DE | 101 34 362 A1 | 1/2003 |
| DE | 10 2004 059 524 A1 | 6/2006 |
| DE | 10 2005 041 375 A1 | 3/2007 |
| DE | 10 2006 025 172 A1 | 12/2007 |
| DE | 10 2006 057 641 A1 | 6/2008 |
| DE | 20 2008 010 082 U1 | 9/2008 |
| EP | 0 215 223 B1 | 3/1987 |
| EP | 0 727 925 A1 | 8/1996 |
| EP | 1 500 638 A1 | 1/2005 |

OTHER PUBLICATIONS

The International Search Report for the corresponding international application No. PCT/EP2013/054936, dated May 15, 2014.

* cited by examiner

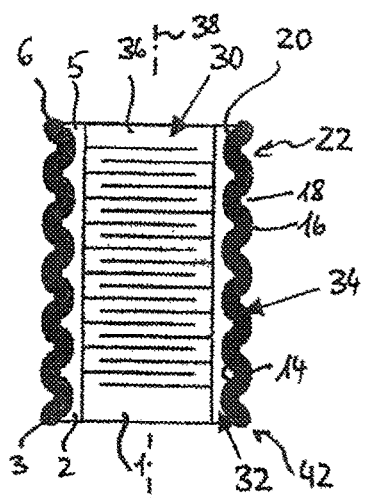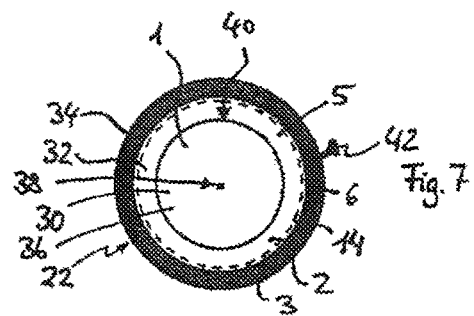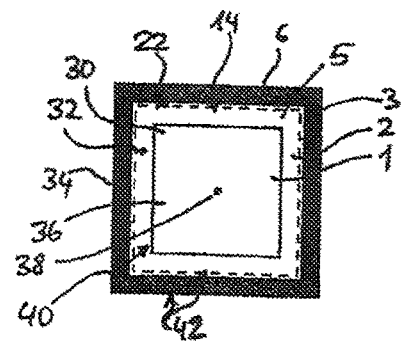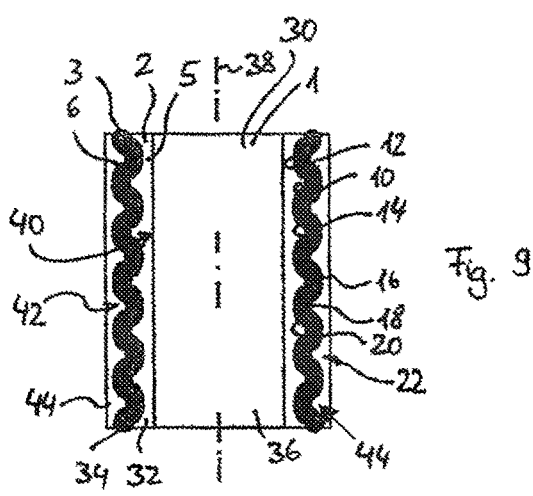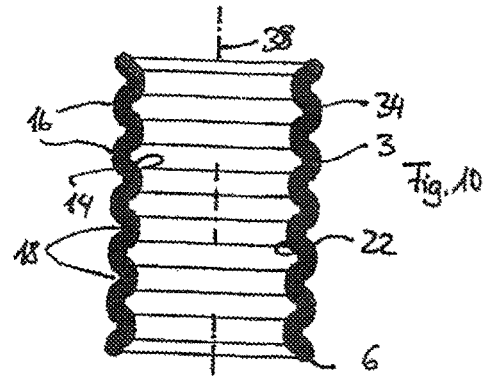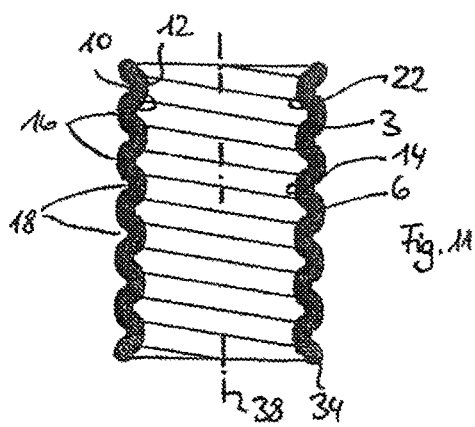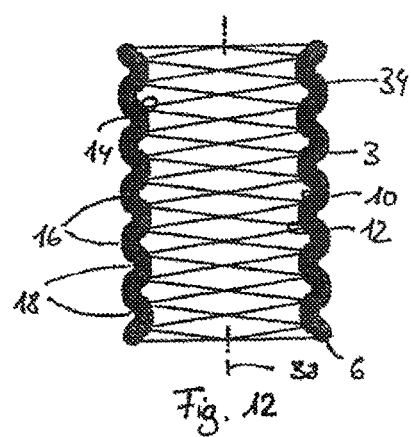

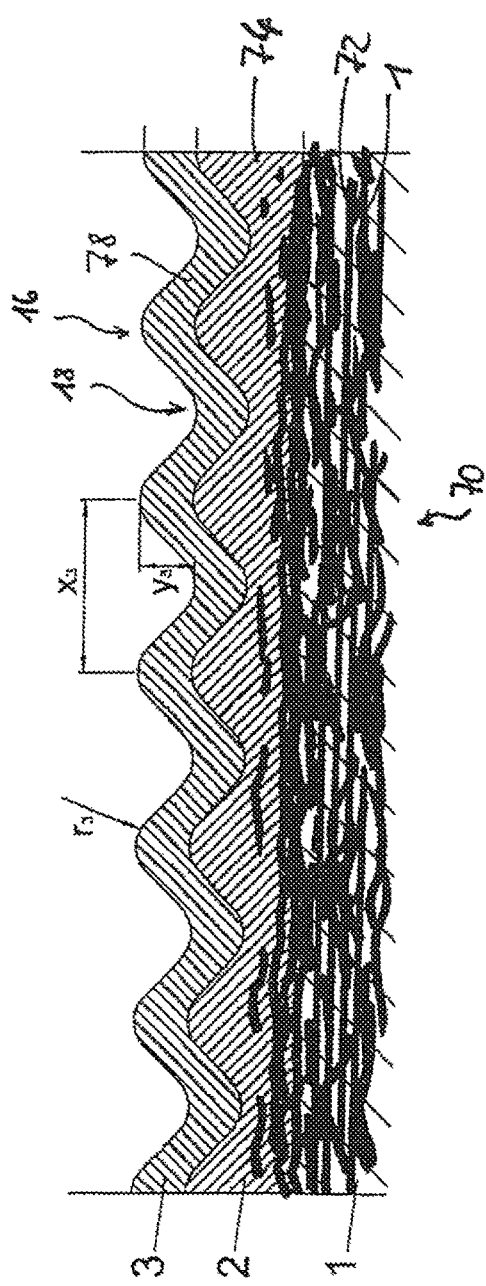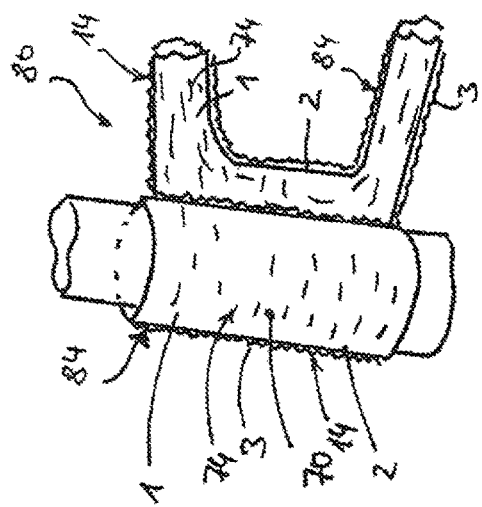

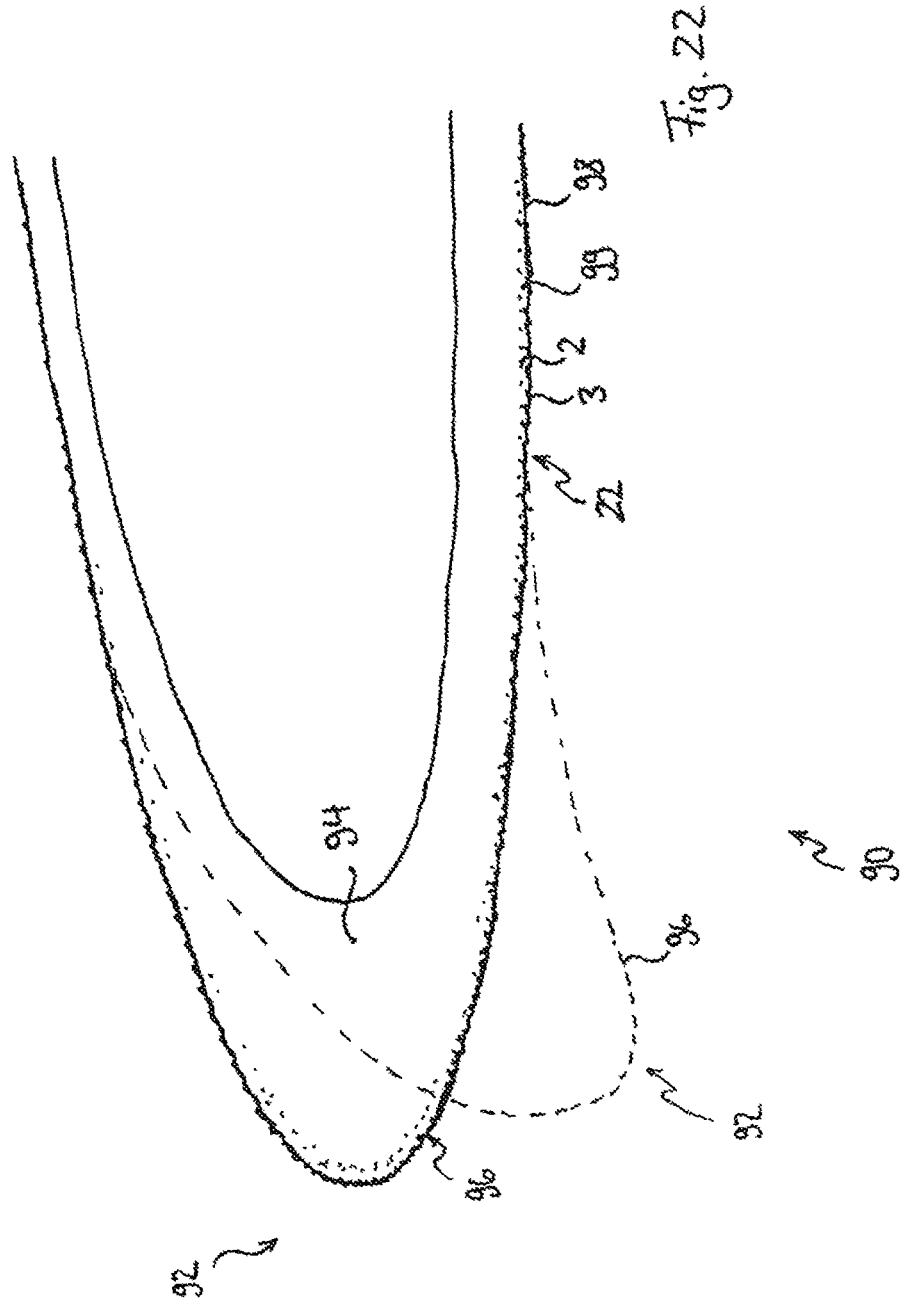

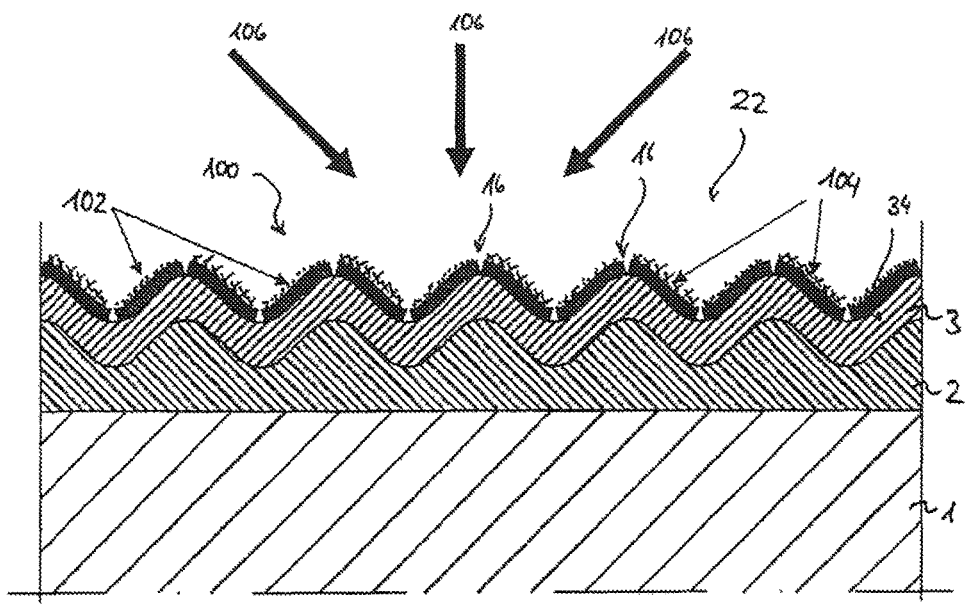

COATING METHOD, SURFACE LAYER STRUCTURE, AS WELL AS APPLICATIONS

CROSS-REFERENCE TO RELATED APPLICATION

This U.S. National stage application claims priority under 35 U.S.C. § 119(a) to German Patent Application No. 10 2012 102 690.4, filed on Mar. 28, 2012, the entire contents of German Patent Application No. 10 2012 102 690.4 are hereby incorporated herein by reference.

BACKGROUND

Field of the Invention

The invention relates to a coating method for the production of at least one function layer on mechanically loaded components or surfaces. Moreover, the invention relates to a surface layer structure producible with such a coating method for providing at least one function layer on such mechanically loaded components or surfaces. Furthermore, the invention relates to various components provided with such surface layer structures or coatings producible in accordance with the coating method, in particular a piezo ceramic component, a metal sheet or a fibre reinforced composite component.

Background Information

In industrial engineering, automotive technology, aircraft engineering, airspace technology or also in other engineering fields such as process technology, actuator engineering or the like, it happens rather frequently that functional components are employed in rough environments. For instance, actors are known in which piezo ceramics are used. It has so far been difficult to use such piezo ceramics under rough conditions such as moist, salty air. The use in aggressive environmental conditions such as those occurring occasionally in process engineering, chemical engineering or the like, is difficult.

In aircraft and airspace technology, it is desirable to provide the most lightweight structural components and functional components possible. In aircraft, for instance, often aluminium materials or other light-metal alloys or fibre composite materials such as CFRP materials are employed. It happens frequently in aviation that such components are subjected to very high environmental loads. For example, very high temperature gradients or even temperature variations may occur within a short period of time, which the components must resist. In the case of components based on a plastic matrix, such as CFRP components, it is desirable to provide measures against UV loads. UV radiation may result in a very strong impairment of the quality of plastic materials.

Mechanical loads—be they caused by layers of air loaded with sand materials or other granular materials, or by other loads that may give rise to scratches—are equally detrimental for components.

SUMMARY

It is therefore desirable to provide different components and surfaces of substrates, objects or items with different functional layers, with the layer structure being provided with the lowest weight possible, whilst it is desirable to achieve a maximum of universal application and the integration of different functional layers, whilst yet the respective coated component should resist high mechanical and thermal—particularly dynamic—loads.

This problem is solved by a coating method as well as a surface layer structure as disclosed herein.

Advantageous applications and fields of application of the surface layer structure and/or coatings producible with the coating method are subject matter of the disclosed embodiments.

The invention provides a coating method for producing a function layer on mechanically loaded components or surfaces, comprising the steps of: providing a first material layer made of a first material with a mechanical flexibility higher than that of a second material at or on a substrate constituting the component or the surface, respectively, structuring the first material layer so that the material layer surface of the first material layer is given a three-dimensionally moulded basic structure with projections and recesses, and coating the material layer surface of the first material layer with a second material layer made of the second material, such that the second material layer substantially adopts the basic structure of the material layer surface with the projections and recesses.

For providing the first material layer, the first material layer may be present, for instance, as part of the substrate already, or the first material layer is applied on the substrate. It is also possible, for example, to provide a substrate matrix of a substrate formed of a fibre composite material with fibres in a matrix as a first material layer. In another example, the first material layer is provided by coating a surface of a substrate with the first material.

In accordance with a preferred embodiment, it is envisaged that the substrate is formed of a substrate material chosen from a group of materials including metal, ceramic, plastic and fibre fabric.

According to a preferred embodiment, it is envisaged that the first material is chosen from a group of materials including metal, plastic and ceramic.

It is preferred that the second material is selected from a group of materials including metal, plastic and ceramic.

The first and the second materials are preferably so selected that the second material has a lower mechanical flexibility or robustness than the first material.

The second material has preferably a higher elastic modulus than the first material.

The second material has preferably a higher hardness than the first material.

The second material displayers preferably a lower breaking elongation or reduction of area at break or fracture toughness than the first material.

The first material layer is preferably formed as a first functional layer in order to provide in this way at least one first function. These may be entirely different functions. Electrical insulation or protection against moisture may be mentioned as examples.

The first material layer is preferably also formed as mould for forming the second material layer.

The second material layer is preferably formed as second functional layer for providing at least one second function.

The second function may equally be highly different. The second functional layer may be an insulating layer, for example, for electrical insulation. Moreover, the second functional layer may be a protective layer for protection from different environmental influences. The second material layer may be designed, for example, as layer protecting against chemical loads. For instance, the second material layer may be formed as protective layer providing protection from corrosive load. The second material layer may be designed as protective layer, for instance, for protection from moisture.

The second material layer may be designed as a protective layer, for example, for protection from mechanical or physical loads.

The second material layer is preferably a protective layer providing protection from thermal loads.

The second material is preferably an electrically conductive function layer or alternatively an electrically insulating function layer.

The second material layer is designed preferably for influencing at least one field. For instance, the second material layer is designed as field-influencing layer for taking an influence on electromagnetic, electric or magnetic fields. For example, the field-influencing layer is a shielding layer for shielding such a field. For example, the field-influencing layer is a shaping layer for the specific shaping of the field.

The first material layer is preferably microscopically structured.

The step "structuring of the first material layer" includes the structuring of the first material layer by means of an energetic beam. A laser beam may be provided as energetic beam. An ion beam may be provided, for instance, as energetic beam. An electron beam may be provided, for example, as energetic beam. Other particular beams may be provided as energetic beam.

The step "structuring of the first material layer" includes preferably the thermal, preferably microscopic, structuring by means of a counter-mould. For example, the counter-mould is heated or it is a hot counter-mould.

The basic structure is preferably embossed onto the material layer surface.

The basic structure is preferably selected, particularly in terms of the shape or the dimensions and size, in consideration of at least one of the following criteria
Level of the load,
Type of the load,
Way of deformation,
Influences of the environment.

The basic structure is preferably designed with a periodic succession of recesses and projections.

The second material layer, which is applied on the appropriately structured first material layer, preferably follows the basic structure and reproduces it.

The second material layer is preferably provided with corresponding recesses and projections.

The second material layer has preferably a wave-like profile cross-section.

The second material layer has preferably a profile cross-section in a sine-wave design.

The second material layer has preferably a meandering profile cross-section.

The projections and recesses of the basic structure and of the second material layer following the basic structure are preferably provided with rounded-off sections at the recesses and projections.

When the basic structure has a wave shape the wave length of the wave shape may be constant or may vary along an extension of the component or the surface.

The first material layer preferably ahs a thickness $d_2$, a constant amplitude or an amplitude varying along an extension between projections and recesses $y_2$ and a constant distance $x_2$ between a maximum projection and a maximum recesses as well as a radius $r_2$ at the curvature at each projection and recess. Each of the values r2, x2, y2, d2 may be designed to remain constant over the entire surface layer structure or may vary along a first direction as a function of the path.

The coating method is preferably applied to produce a protective coating system, in particular a moisture protection for a piezo ceramic component.

The coating method preferably serves to coat a sheet metal with a primer layer and a varnish layer, with the interface between the primer layer and the varnish layer and the varnish layer as such being provided with the basic structure.

The coating method is preferably applied to produce a fibre composite material with metallization. The fibres constitute, for instance, the substrate material; the matrix forms the first material, for example, and the metallization forms, the second material, for instance.

The coating method is preferably employed to produce an UV-protection layer on Solid joints made of a fibre material. The fibres form the substrate material, the matrix constitutes, for instance, the first material, and the UV protection layer forms the second material, for example. Other function layers can be created accordingly on such components.

In accordance with another aspect, the invention provides a surface layer structure for providing a function layer on mechanically loaded components or surfaces, comprising:
a substrate made of a substrate material,
a first material layer made of a first material with a mechanical flexibility higher than that of a second material, with the first material layer existing on or being applied on the substrate,
wherein the first material layer is provided with a three-dimensionally shaped basic structure with projections and recesses on the material layer surface opposite to the substrate, and
wherein the first material layer is coated with a second material layer made of the second material, with the second material layer being substantially formed, on the whole, in correspondence with the basic structure of the material layer surface with the projections and recesses.

It is preferred that the substrate material is selected from a group of material including metal, ceramic, plastic and fibre fabric.

It is preferred that the first material is selected from a group of materials including metal, plastic and ceramic.

The substrate material and the first material may be identical. For instance, the first material layer may be a sub-portion of the substrate, which need not be delimited from the remaining material of the substrate. In accordance with another embodiment, the first material, e.g. the coating or the like, is applied on the substrate. The first material may also be a substrate matrix, for instance, such as resin in a fibre composite material.

It is preferred that the second material is selected form a group of materials including metal, plastic and ceramic.

The second material has preferably a modulus of elasticity in the surface layer structure, which is higher than the modulus of the first material.

According to a preferred surface layer structure, the second material has a higher hardness than the first material.

According to a preferred surface layer structure, the second material prevents a lower elongation at break than the first material.

It is preferred that the first material layer is
an insulating layer providing electrical insulation,
a protective layer providing protection from moisture and/or is a resilient buffer layer for the resilient balancing of relative displacements or relative movements between the second material layer and the substrate
and/or
that the second material layer is
a protective layer providing protection from chemical loads,
a protective layer providing protection from mechanical or physical loads,
a protective layer providing protection from thermal loads,
an electrically conductive or an insulating function layer, and/or
a field-influencing layer for taking an influence on electromagnetic, electric or magnetic fields.

In the coating method or the surface layer structure, the first material layer constitutes preferably a resilient buffer layer for resilient balancing of relative displacements or relative movements between the second material layer and the substrate. With this provision, resulting relative movements can be balanced when static or dynamic, mechanical or thermal loads occur.

A type of sandwich structure with the substrate surface to be coated on the first side and the harder second material layer as function layer on the other side and a more resilient interposed layer in the form of the first material layer is preferably created. On account of the basic structure, the second material layer is provided with appropriate potentials for mechanical and thermal balancing. For instance, the basic structure, which the second material layer adopts, resembles the shape of a metal bellows that can be contracted and compressed in an accordion-like manner.

The basic structure is preferably bellows-shaped. The profile of the second material layer is preferably shaped in a wave form in a section along a deformation line of the component.

For instance, the component or the substrate to be coated is a pin-shaped or elongated component whilst the surface to be coated is a peripheral surface. In such a case, a basic structure is preferably provided which presents a wave structure or zigzag structure in the longitudinal section along the longitudinal extension (axial extension).

In the longitudinal section through such a peripheral sheathing produced according to the coating method of the kind in question here, the projections and recesses may be provided in a rotationally symmetric arrangement or in parallel on opposite sides.

In accordance to another preferred embodiment, the projections or recesses may extend obliquely relative to the longitudinal axis. Some kind of coil structure is conceivable. Alternatively, an oblique structure is possible, in which the projections or recesses are provided in a ring-like form, with the extension plane of the ring being configured to be oblique relative to the central axis of the peripheral surface to be coated.

When the component has a flat structure rather than an elongated one different basic structures in a periodic or geometrically organized structure are equally possible.

For example, the projections or recesses may be designed as concentric rings or concentric rectangles or squares or any other concentrically circumferential geo metric shapes (hexagons, pentagons, octagons, etc.). Concentric ellipsoid shapes are equally possible. Moreover, the projections and recesses may also present a helical structure.

It is preferred that the projections are provided as ribs whilst the recesses are formed as flutes or grooves between the ribs.

The ribs and flutes are preferably disposed for extension with at least one direction component that is transverse relative to a direction of deformation of the component or surface.

The invention provides a method for the production of a function layer with a long service life for mechanically loaded components or surfaces.

Moreover, the invention provides a layer structure for the provision of a function layer with a high service life on mechanically loaded components or surfaces.

By application of the methods and surface layer structures or their advantageous embodiments, which are described in the present invention, components or surfaces are structured in such a way that at least one additional functional, mechanically loadable layer can be applied. This additional functional, mechanically loadable layer preferably serves as protector, e.g. for protection from corrosive load—e.g. moisture—, from mechanical loads—e.g. scratches—or is provided for thermal reasons—e.g. increased heat dissipation—, for electrical or inductive functions.

Comparable methods or surface layer structure of this type have so far not become known, which could offer comparable properties and potentials.

With the methods or layer structures presented here it is possible in particular to apply materials with a higher elastic modulus, higher hardness or lower breaking elongation (compared against the coated substrate) on a surface subjected to strong mechanical loads, which is capable of resisting a high static and/or dynamic load.

DESCRIPTION OF THE DRAWINGS

The invention will be explained in more details in the following, with reference to the enclosed drawings. In the drawings:

FIG. 6 depicts a schematic partial sectional view of a first embodiment of application and a first embodiment of the coating method as well as of a surface layer structure that can be produced with this method, by the example of a moisture protection for piezo ceramic, wherein a side view with a section taken through the surface layer structure appearing in outlines;

FIG. 7 shows a plan view of a first exemplary embodiment of the piezo ceramic provided with a moisture protection, having an elongate formation with a round cross-section—cylindrical shape—:

FIG. 8 illustrates a plan view of another embodiment of the piezo ceramic provided with a moisture protection, with the piezo ceramic presenting an elongated design with an angular basic shape (e.g. bar shape);

FIG. 9 is a side view of another embodiment with an additional protective layer;

FIGS. 10 to 12 depict schematic illustrations of a second outer material layer of the moisture protection, with variants for different structure designs;

FIG. 20 is a schematic cross-sectional view of another component having a surface layer structure coated according to the coating method in correspondence with FIGS. 1 to 5, by the example of a metallised fibre composite material;

FIG. 21 is a schematic illustration of a further embodiment of a surface layer structure that can be produced with the coating method according to FIGS. 1 to 5, by the example of a functional protective layer for solid joints made of a fibre material for UV protection;

FIG. 22 shows a schematic illustration of a further embodiment of a surface coating that can be produced with the coating method according to FIGS. 1 to 5, by the example of wing leading edge having a variable shape; and FIG. 23 is a schematic illustration of another embodiment of a surface coating that can be produced with the coating method according to FIGS. 1 to 5, by the example of colour coating of a structured surface for achieving varying optical effects.

DETAILED DESCRIPTION OF EMBODIMENTS

In the following, first a fundamental principle of a conceivable embodiment of a coating method will be explained with reference to FIGS. 1 to 5.

Figure 1:
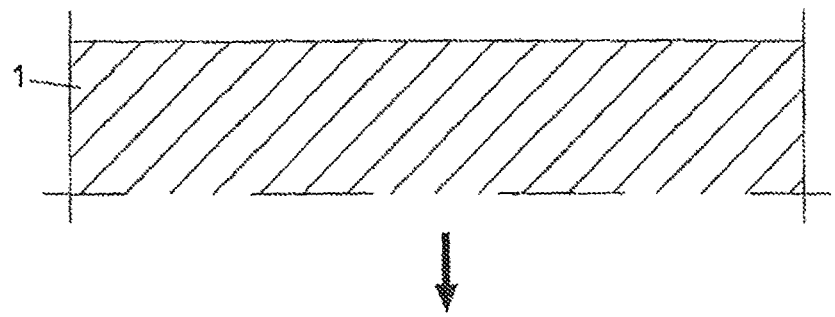
FIG. 1 to FIG. 5 depict schematic cross-sectional views of different steps of process in a coating method for the production of a function layer having a long serviced life for mechanically loaded components or surfaces.

FIG. 1 illustrates schematically a first step of providing a substrate 1.

Figure 2:
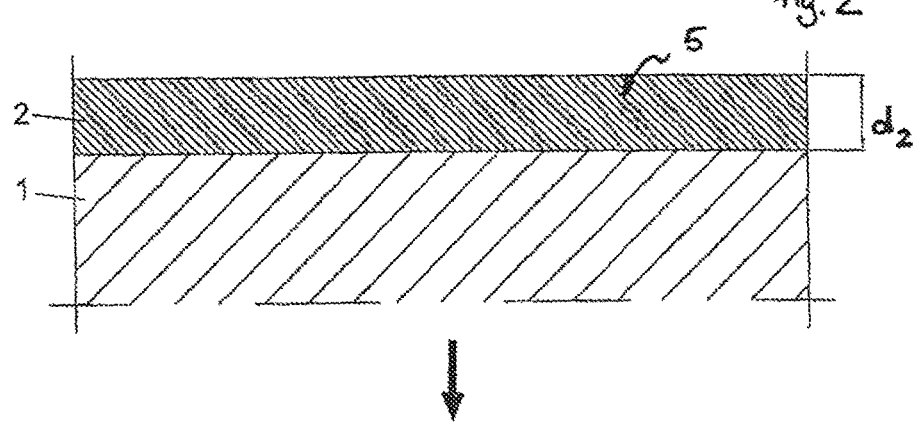

FIG. 2 shows a second step of coating the substrate 1 with a first material layer 2 consisting of a first material 5 having a thickness $d_2$ on a surface of the substrate 1.

Figure 3:
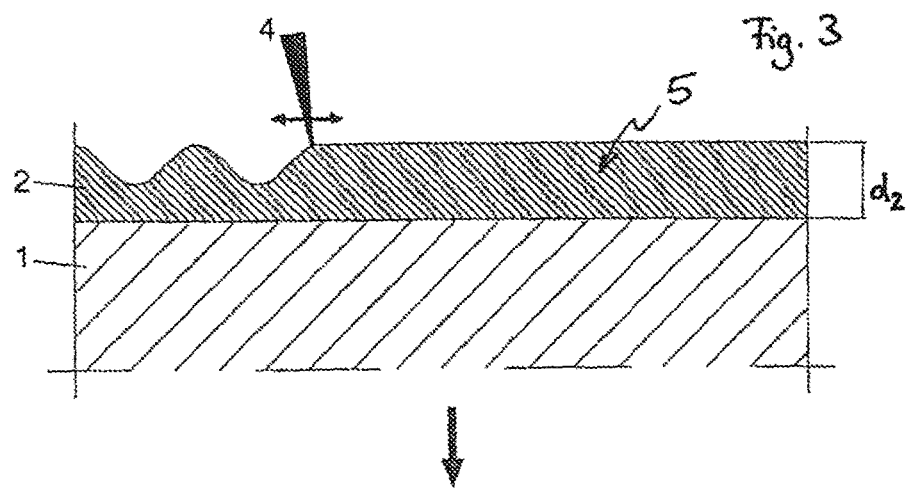

FIG. 3 shows a third step of the coating method. This step relates to the structuring of a material layer surface of the first material layer 2 on the side opposite to the substrate 1, by means of a suitable structuring tool 4

Figure 4:
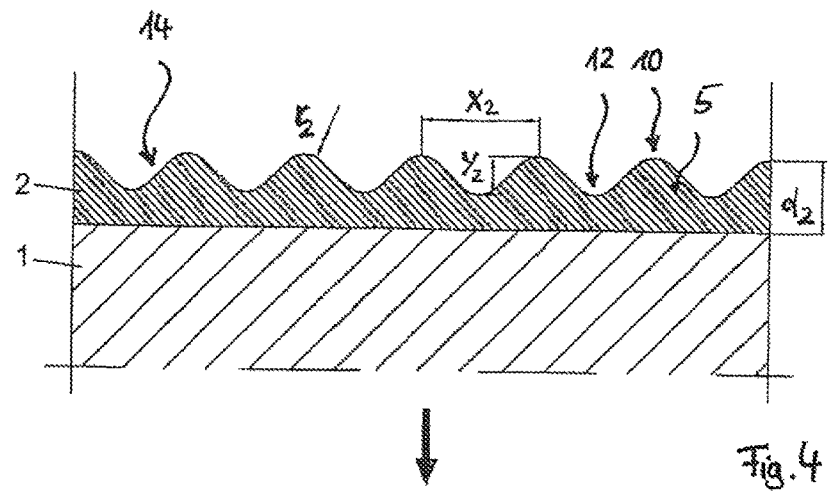

As can be seen in FIG. 4, a basic structure with projections 10 and recesses 12 is created on this material layer surface.

In the illustrated embodiment, the basic structure has a wave-like configuration.

In the illustrated embodiment, the basic structure is designed, for instance, with a periodic configuration providing constant distances $x_2$ between two maximum projections 10 and with constant distances $y_2$ between the respective maximum projections 10 and the lowest point of the recess 12 (seen in a direction of thickness $d_2$). The basic structure 14 is provided with an equally constant radius $r_2$ at the extreme points on the projections 10 and the recesses 12.

Figure 5:
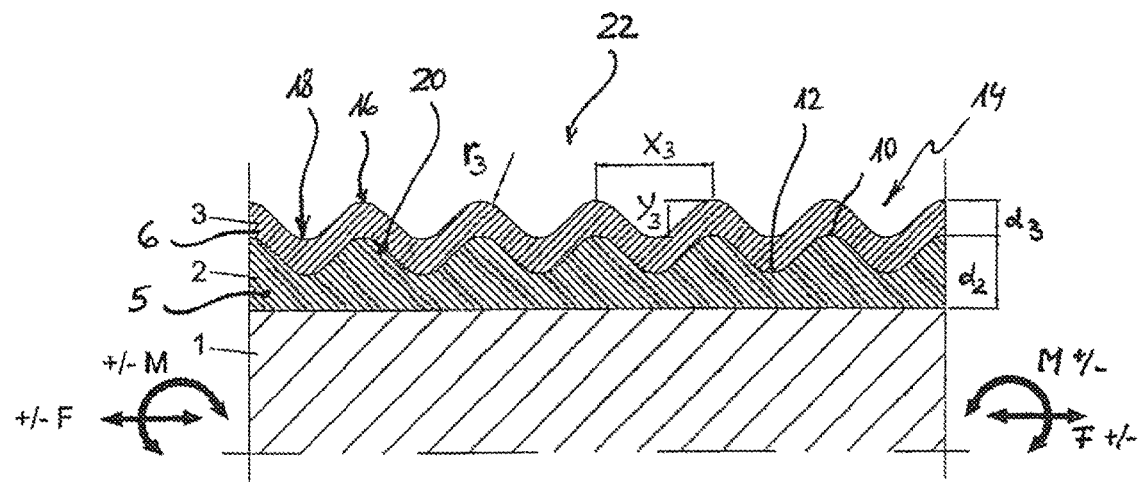

FIG. 5 shows the fifth step in the coating method, in which a second material layer 3 of a second material 6 is applied onto the basic structure 14 on the material layer surface of the first material layer 2. The application takes place in such a way that the second material layer 3 is moulded in correspondence with the basic structure 14 and conforms to this basic structure with all projections 10 and recesses 12 in an approximately constant thickness $d_3$. Hence, projections 16 and recesses 18 are equally provided on the free surface of the second material layer 3 that is opposite to the substrate 1, which are provided at the same points as the projections 10 and recesses 12 on the basic structure 14 of the material layer surface interface 20 between the material layers 2, 3.

The maximums of the projections 16 present a distance $x_3$. The lowest points of the recesses 18 and the highest points of the projections 16 present the distance $y_3$, seen in the direction of the thickness; and the curvatures on the projections 16 or recesses 18 present the radius $r_3$.

As can be seen in FIG. 5 the substrate may be deformed on account of the force F in the x-direction (e.g. the longitudinal direction of a component formed of the substrate) or may be warped or twisted about the longitudinal extension on account of a torque M.

For instance, Metal, ceramic, plastic or fibre fabric may be provided as substrate material of the substrate 1.

A metal, plastic or ceramic with a mechanical deformability higher than that of the second material 6 of the second material layer 3 may be provided as the first material 5 of the first material layer 2, for instance.

A metal, plastic or ceramic with a mechanical deformability lower than that of the first material 5 may be provided as the second material 6 of the second material layer 3, for instance.

As can be seen in the steps of FIGS. 1 to 5, the first material 5 is applied as the first material layer 2 on the substrate 1 and is then microscopically structure, preferably by means of an energetic beam 4 such as a laser beam, an ion beam or an electron beam. It is also conceivable that the substrate 1 is thermally structured with a suitable structured counter-mould—comparable to a hot die or roller. It is a prerequisite in the latter case that the substrate 1 resists the mechanical pressure loads during the embossing process.

The first material layer 2 with the first material 5 serves as functional layer or function layer—e.g. as the first function: electrical insulation or moisture protection—and as mould for the second material layer 3 at the same time.

The first material 5 should be so selected that the static or dynamic loads—traction/compression forces F and/or torques M—subject it to a merely resilient or only a slightly plastic load.

The second material layer 3 is applied on the first material 5 of the first material layer 2 in such a way—e.g. deposition from the gaseous phase, thermal spraying, cold-gas spraying or electroplating that it adopts essentially the basic structure 14 of the latter.

Depending on the load level, the type of the load, the path of deformation and influences from the environment, a suitable structure on the first material layer 2 is selected with defined shape dimensions and size dimensions—e.g. radius $r_2$, distance $x_2$, amplitude $y_2$ and thickness $d_2$.

The second material layer 3 serves equally as functional layer of function layer. For example, this second material layer 3 is a protective layer providing protection from corrosive loads (e.g. moisture), from mechanical loads (e.g. scratches) or for reasons of a thermal function (e.g. amplified heat dissipation), an electrical function and/or an inductive function. For instance, different shielding measures may be provided for shielding from or of different fields (electric fields, magnetic fields, electromagnetic fields). It is also possible, however, to shape or influence fields in a targeted way.

The second material 6 of the second material layer 3 is mechanically less flexible or robust, respectively, than the first material 5.

For instance, the second material 6 has a higher modulus of elasticity, a higher hardness or a lower elongation at rupture than the first material 5.

The specific geometric shape—basic structure 14—is expedient so that this second material layer 3, of a correspondingly more robust/resistive nature, can also resist the static and/or dynamic load. This specific geometric shape is indirectly created by the structuring of the first material layer 2.

For instance, the second material layer 2 is shaped like a bellows on account of the wave-like basic structure 14, and can correspondingly be compressed or stretched.

The second material 6 may act like a spring, for instance, with an appropriate specific geometric formation, and with a defined deformation path, it covers a smaller area than a planar layer. Compared against the planar layer, the appropriate deformed material layer 3 behaves as a spring compared against a tension bar, in particular.

With this general coating method as explained with reference to FIGS. 1 to 5 one can produce highly different surface layer structures 22.

With a modification of the method explained with reference to FIGS. 1 to 5, the first material layer is provided as part of the substrate, e.g. as an upper interface region of the substrate. In other words, one part of the substrate constitutes the first material; and in the third step, the surface of the substrate is appropriately structured as has been explained above by the example of a separately applied first material layer.

In the following, special embodiments will be explained in more detail.

FIGS. 6 to 18 relate to a first embodiment in which a piezo ceramic is provided with a moisture protection by the coating method.

As is shown in FIG. 6, a piezo ceramic 30 is provided as the substrate material 1. The component formed of the piezo ceramic 30 may expand or contract in correspondence with an applied voltage along a preferred direction of expansion—corresponding to the x-direction in FIG. 5. It is correspondingly possible to produce an actor for the operation of mechanical movements in response to a change of voltage from the piezo ceramic 30.

According to FIGS. 6 to 18, a thin insulating layer 32 is provided as the first material layer 2, which consists of the material Parylene. The insulating layer presents a thickness $d_2$ in the range from 1 to 50 µm, preferably between 10 and 20 µm, and most preferably at roughly 15 µm. The dimensions of the individual layers and the values $r_2$, $x_2$, $y_2$, $d_2$ are lower than 100 µm, in particular within the range between 0.1 µm and 30 µm. A metal layer is provided as second material layer 3. For instance, aluminium is provided with a thickness $d_3$ of 1 to 10 µm, preferably 5 µm.

In the method for the production of the surface layer structure 22 on the piezo ceramic 30, a laser structures the Parylene layer 32 on a piezo ceramic 30. Subsequently, an aluminium layer 34 is vapour-deposited. A dynamic load is induced via the actuator mechanism of the piezos.

This surface layer structure 22 ensures a reliable application of the piezo ceramic 30 under rough environmental conditions such as humid salty air. The protective layer—metal layer 34—displays both very good fatigue strength and a lower thermal resistance at high environmental temperatures particularly with high dynamic demands on the actuator system.

It has so far been common to provide piezo ceramic with an envelope in the form of a varnish layer in order to protect them from moisture. Such a varnish layer only delays, however, the diffusion process. It is merely possible to set the time up to the point by which the critical moisture/salt level at the ceramic surface is reached, via the thickness of the varnish layer. Hereby applies: the thicker the varnish layer, the less heat is dissipated. Emerging electric fields enforce a chemical reaction on the varnish surface, which may result in destruction of the varnish.

In another common approach, the piezo ceramic (so-called stack) is encapsulated in a metal bellows with connexion plates. Even though such a solution provides very good protection from any influence from the outside, it is accompanied by a distinct increase of weight and high manufacturing costs.

In the approach taken here, the piezo ceramic 30 is initially provided with a thin insulation layer 32 (e.g. Parylene, 15 µm). In a further step, this insulation layer 32 is structured by means of a laser 4 or the like and subsequently a metal coating—metal layer 34 (e.g. aluminium, 5 µm)—is applied. In order to avoid fatigue of a metal coating under high dynamic loads, it is a to expose the coating also to a bending load rather than to a traction load exclusively. The employed structure of the applied metal coating resembles the structure of a metal bellows that is subjected to a low load only even with a high mechanical deformation. The metal layer 34 hence remains permanently in good order and provides optimum protection from moisture.

Prominent advantages of the surface layer structure 22 presented here are, for instance:

a very small thickness of the protective layer 42 (formed of the layers 32, 34; roughly 20 µm);
an electric field is encapsulated to the outside so that electrolyses cannot occur;
on account of the thinner layers 32, 34 a good heat dissipation is ensured;
on account of the metal layer 34, a good heat distribution is achieved;
there is no weight increase;
the manufacturing process is very simple;
the piezo ceramic 30 is protected from being touched;
there are no restrictions in the integration of the piezo ceramic.

The FIGS. 6 to 18 show different conceivable shapes of the piezo ceramic 30 with the surface layer structure 22.

FIG. 6 illustrates a side view of an elongate piezo ceramic component 36 that can expand or contract when a voltage is applied along its longitudinal central axis 38. The peripheral surface 40, which extends in parallel with the longitudinal central axis 38, is provided with the protective layer 42 that is constituted by the insulating layer 32—first material layer 2—and the metal layer 34—second material layer 3.

FIGS. 7 and 8 are plan views of different shapes of the base area of the piezo ceramic component 36; as is illustrated in FIG. 7, they may be configured as round shapes or also as angular shapes, as is shown in FIG. 8.

FIG. 9 illustrates another embodiment of the piezo ceramic component 36 provided with the protective layer 42, in which an additional protective layer 44 is provided for protection from scratching on the outside on the metal layer 34. The additional protective layer 44 displays preferably high resilience properties, too, similar to those of the first material, in order to be able to follow the movements of contraction or elongation of the piezo ceramic component 36 along the longitudinal central axis 38.

FIGS. 10 to 12 shoe examples of different structuring systems on the peripheral surface 40.

For instance, the projections and recesses 16, 18 of the second material layer 3 may be designed in parallel, i.e. substantially orthogonal to the longitudinal central axis 38, as is shown in FIG. 10.

FIG. 11 illustrates another potential embodiment in which the projections and recesses 16, 18 are equally ring-shaped designs, however with the ring planes not extending orthogonally on the longitudinal central axis 38 but with an inclination thereto.

FIG. 12 shows a further embodiment with an extension of the projections 16 and recesses 18 in dual inclination. For instance, the projections and recesses are helical here, like the surface of a thread formed on a screw shaft.

Whereas FIGS. 6 to 12 show an elongate formation of a piezo ceramic component 36 in a longitudinal extension along a longitudinal central axis 38 so that the component 36 is designed in a pencil-shaped or bar-like form, for instance, the further schematic embodiments shown in FIGS. 13 to 17 illustrate a piezo ceramic component 36 configured as disc or plate. For instance, the disc or plate may expand (e.g. enlargement of the diameter or radius) or contract, depending on the voltage applied, in the plane of the disc.

Figure 13:
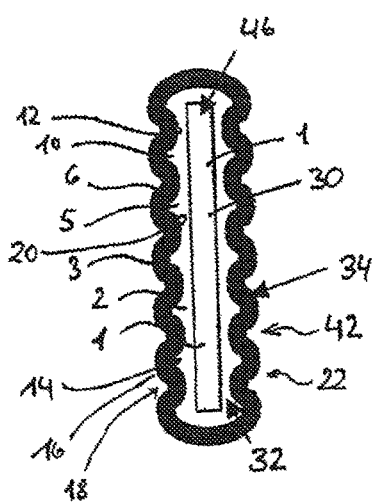
FIG. 13 is a side view of another embodiment of a piezo ceramic component with moisture protection, wherein the piezo ceramic has the form of a disc or leaf.
Figure 14:
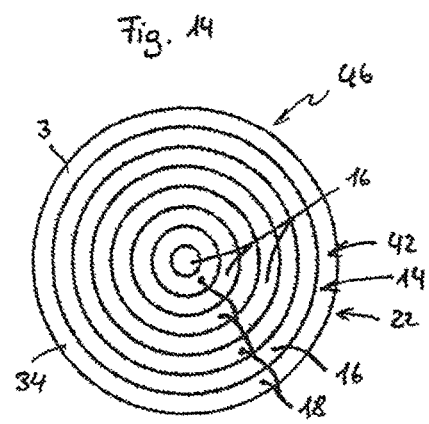
FIGS. 14 to 17 are plan views of different embodiments of the disc-shaped or plate-shaped piezo ceramic with different structuring variants of the moisture protection.
Figure 15:
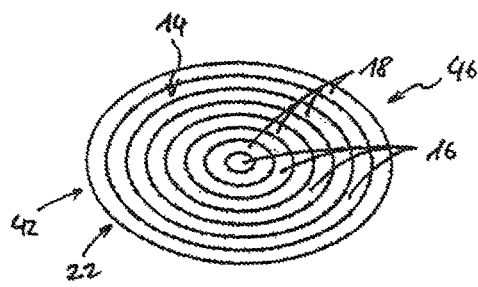

As is shown in FIG. 13, this piezo ceramic component 46 is provided with the insulating layer 32 and the metal layer 34, too, which form jointly the protective layer 42 for protection from moisture.

Figure 16:
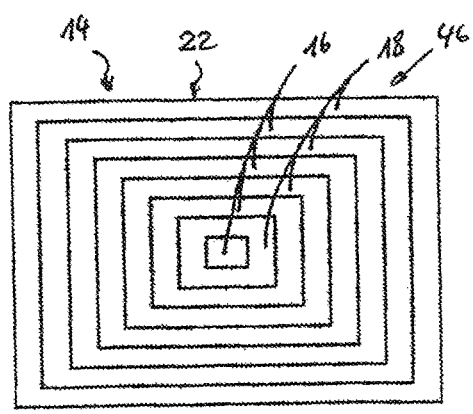

As is illustrated in FIGS. 14 to 17, here the projections 16 and the recesses 18 may be provided as concentric rings, e.g. circular rings or elliptical rings. FIG. 16 shows another possibility in which a piezo ceramic component 46, designed as angular plate, is provided with the basic structure 14 whose projections 61 and recesses 18 are configured as concentric rectangles.

Figure 17:
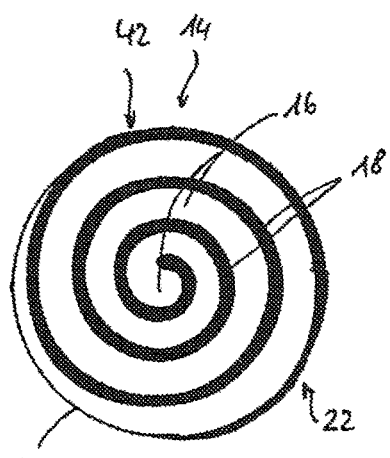

FIG. 17 shows a helical course of the flute-like projection 16 or the adjacent recess 18.

Figure 18:
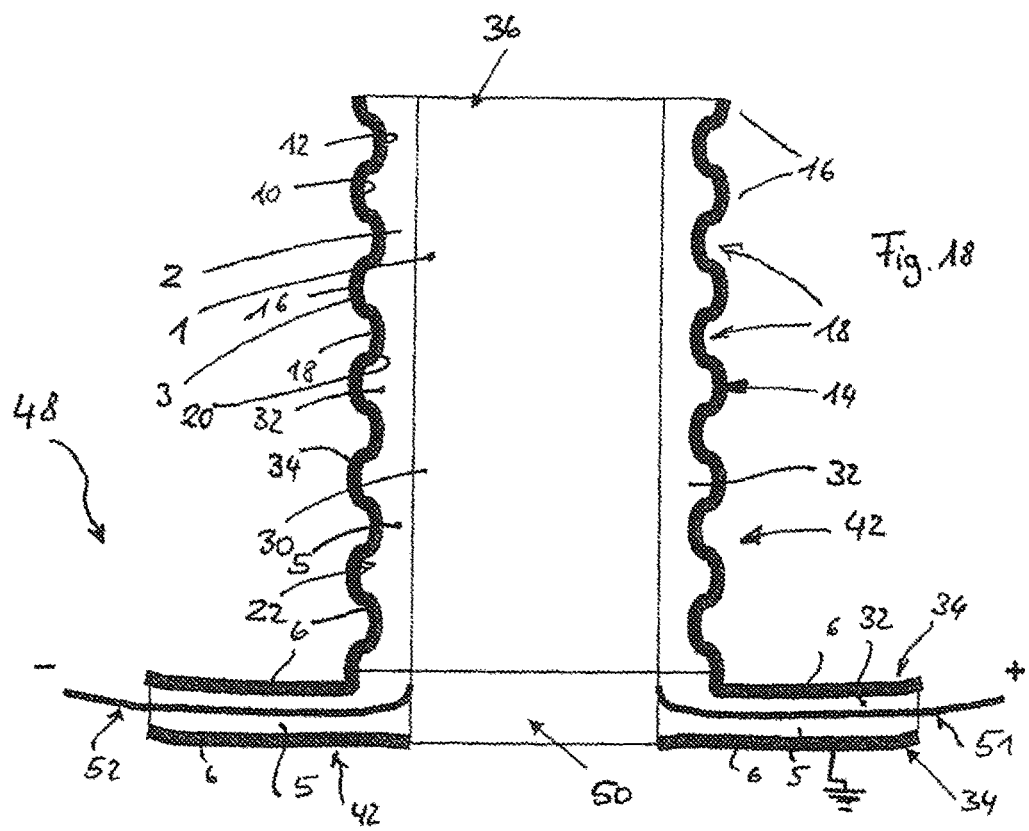
FIG. 18 shows a side view of another embodiment of a moisture protection for a piezo ceramic with an example of a possible cable link.

FIG. 18 is a side view showing the example of FIG. 6 to illustrate that the insulating layer 32 and the metal layer 34 may also be expediently used for achieving a possible cable link 44. To this end, a passive component 50 is provided, which joins the piezo ceramic component 36, wherein the insulating layer 32—first material layer 2—is continued on the left and the right sides as extension, laterally relative to this passive component 50, for insulating two connecting cables 51, 52. This insulating layer 32, which is provided as coating around the connecting cables 51, 52, is equally provided with the metal layer 34.

For the formation of this possible cable link 48, one operates in such a way that initially in the step shown in FIG. 1 the piezo ceramic component 36 is provided as substrate 1, together with the passive component 50 and the two connecting cables 51, 52. Subsequently, the peripheral surface 40 of both the piezo ceramic 30 and the two connecting cables is provided with the first material layer 2 (Parylene) in order to form the insulating layer 32. Then the first material layer 2 is structured, but only in the region of the peripheral surface 40 of the piezo ceramic 30. Subsequently, the metal layer 34 is vapour-deposited so that it adopts the basic structure on the peripheral surfaced 40, whilst all around the passive component 50 and the connecting cables 51, 52, however, a straight structure is achieved.

The coating method described her is particularly advantageous for the provision of an efficient protection from moisture and the provision of a protective layer with further functions for piezo ceramics, as is illustrated. However, the invention is not restricted to this application.

Figure 19:
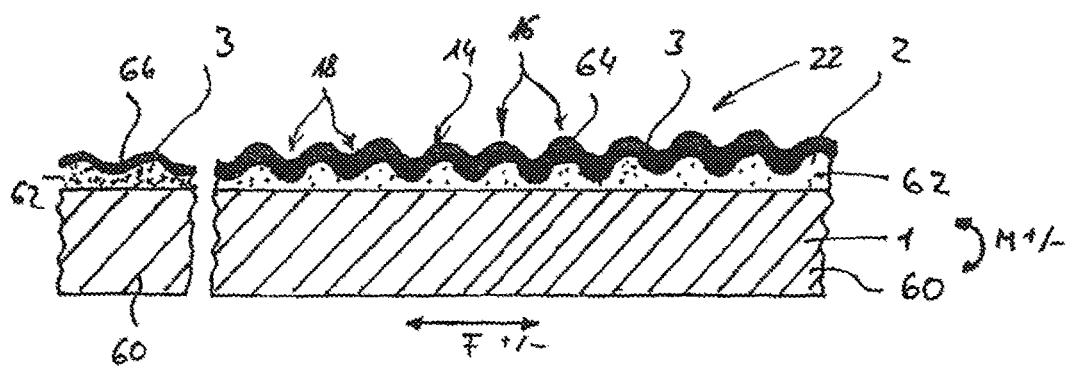
FIG. 19 is a schematic cross-sectional view through another embodiment of a surface layer structure that can be produced with the coating method according to FIGS. 1 to 5, by the example of a sheet metal plate with a primer layer and a varnish layer.

FIG. 19 shows another surface layer structure 22 that can be produced by the method according to FIGS. 1 to 5, by the example of a metal sheet 60 with a varnish as protective layer 42. In that embodiment, the metal sheet 60 constitutes the substrate 1. For instance, here an aluminium sheet is provided as metal sheet 60. A primer layer 62 is applied as the first material layer 2 on the metal sheet 20. The primer layer 62 serves for promoting adherence between a varnish material and the metal in the metal sheet, for example. This primer layer 62 constitutes the first material layer 2. This primer layer 62 is structured—for instance by means of a laser 4—in order to preserve the basic structure 145.

Then a thin layer of the second material layer 3 is applied on this appropriately structured primer layer 62. For example, here a hard varnish 64 (Top Coat) or a tungsten-carbide layer 66 (protection from erosion) is applied on the basic structure 14 so that the varnish 64 or the tungsten-carbide layer 66 will conform to the basic structure with projections 16 and recesses 18. A dynamic load is induced by cyclic heating/cooling of the metal sheet 60, which results in expansion of the metal sheet 60 or in its contraction. The second material layer 3, designed as varnish 64 or tungsten carbide layer 66, can easily follow these dynamic loads in the manner of a metal bellows, despite its higher hardness on account of the shaping by the basic structure 14.

FIG. 20 shows a third general embodiment of a coated CFRP component 70. This CFRP component comprises fibres 72, e.g. carbon fibres, as substrate material. The first material layer 2 is formed by the resin 74 of the matrix of the CFRP component 70. A laser 4 structures the CFRP material 76 so that the basic structure 14 is created on the surface of the resin 74. Subsequently, the structured resin 74 is metallised, e.g. by electroplating, thermal spraying, cold-gas spraying or plasma deposition. The metal layer 78 so formed constitutes the second material layer 3. A dynamic load is induced via cyclic heating or cooling of the CFRP component 78. On account of its formation, the metal layer 78 can easily follow this dynamic loading.

FIG. 21 illustrates another embodiment wherein a functional protective layer 84 is applied, for UV protection, on a solid joint 80 made of a fibre material 82 with a resin matrix 74.

FIG. 22 is a view of another embodiment. According to this further embodiment, a deformable aerodynamic component 90 is provided with the surface structure 22. The second material layer has the function of a layer for protection from erosion. On account of the structuring, the surface structure may follow deformations of the aerodynamic component.

The aerodynamic component 90 is an aerodynamic profile, for instance, which is deformable by means of actors not illustrated here, e.g. for the employment in aircraft as wing part or as part of a control surface or a rotor, or for application in power installations, for instance, e.g. wind or hydroelectric rotor wings or the like.

The graphic in FIG. 22 shows the side view of a wing leading edge 92 (droop nose) that can be lowered and that can be deformed by means of actors (not illustrated here), as a concrete embodiment of an aerodynamic component 90. The major part of the wing leading edge 92 consists of GRP 94 (glass-fibre reinforced plastic) because this material satisfies the requirements in terms of deformability (up to 2%). For resistance to the high erosion loads caused by rain and sand, the leading edge 92 is provided with a layer 96 stable in terms of erosion. Thermally sprayed or electroplated metal layers 98 are suitable, for instance, to this end.

The metal layer 98 is applied here as the second material layer 3 on a laser-structured primer layer 99 (first material layer 2) in accordance with the coating method explained here. The flexibility of the structured primer layer 99 supports the deformability of the metal layer 98.

FIG. 22 illustrates the wing leading edge 92 (droop nose) variables in shape in the initial condition (continuous lines) and in the lowered state (dashed line). Another example for application of the surface structure 22 is illustrated in FIG.

23. Here, the structuring with projections 16 and recesses 18 is utilized for generating different optical effects, depending on the relative angle of viewing on the surface layer structure 22.

The surface 34 with a metallic structure enables the application of a colour coat 100 whose colour effect depends on the viewing angle (cf. FIG. 23). The UV direct printing process offers itself, for instance, as conceivable printing technology, which hardens the respectively associated partial picture from the respective viewing directions. The result could be auto-stereoscopic changing pictures 102, 104 (a "flip image"), for example. The optical effect achieved with this method may be utilized, for instance:
for marketing purposes or
for function checking.

With such optical effects, it is possible, for instance, to perform a sensor-less analysis of structures variable in terms of shape. This should be explained by the example of the wing leading edge 92 in FIG. 22, which is variable in shape. On account of the optical effect depending on the relative viewing angle, it is simple to observe a progress of the change in colour in the course of time during descent, e.g. simply by observation from a constant view angle (e.g. from the cockpit of an airplane on the wing leading edge 92).

FIG. 23 illustrates a colour coating 100 on a structured surface for achieving changing optical effects. The sub-areas of a first picture 102 (e.g. red colour) are applied on first flanks 101 of the projections 16, and the sub-areas of a second picture 104 (e.g. blue colour) are applied on second flanks 103 of the projections 16, which are opposite to the first flanks. Depending on the viewing angle 106, then either the first picture 102 (e.g. red area), the second picture 104 (e.g. blue area) or a mixture of the first picture 102 and the second picture 104 (e.g. violet area) results as the optical effect.

The invention claimed is:

1. A coating method for producing a function layer on a substrate formed of a substrate material including one of a metal sheet and a fiber composite component, the substrate deforming in response to a force in a longitudinal direction of the substrate, and warping or twisting about the longitudinal direction in response to a torque impose on the substrate, the method comprising:
providing a first material layer made of a first material with a mechanical flexibility higher than that of a second material at or on the substrate, such that the first material exhibits a resilient load in response to the deforming, warping and twisting of the substrate;
structuring the first material layer so that the material layer surface of the first material layer is given a three-dimensionally moulded basic structure with projections and recesses; and
coating the material layer surface of the first material layer with a second material layer made of the second material, such that the second material layer adopts substantially the basic structure of the material layer surface with the projections and recesses.

2. The coating method according to claim 1, wherein at least one of the following
the substrate is formed of a substrate material selected from a group of materials including metal, ceramic, plastic and fibre fabric;
the first material is selected from a group of materials including metal, plastic and ceramic; and
the second material is selected from a group of materials including metal, plastic and ceramic.

3. The coating method according to claim 2, wherein
the providing includes selecting the first material and the second material such that the second material has at least one of the following
a higher modulus of elasticity than the first material,
a higher hardness than the first material,
a lower breaking elongation, reduction of area at break, and fracture toughness than the first material, and
a lower dynamic strength than the first material.

4. The coating according to claim 2, further comprising providing or forming the first material layer both as first function layer for providing at least a first function or as a mold for formation of the second material layer; and
forming the second material layer as second function layer for providing at least one second function.

5. The coating method according to claim 2, wherein
the structuring of the first material layer includes at least one of the following:
microscopic structuring of the first material layer by an energetic beam, a laser beam, an ion beam or an electron beam;
thermal microscopic structuring by a heated counter-mould; and
microscopic embossing the basic structure on the material layer surface.

6. The coating method according to claim 2, wherein
the structuring of the first material layer includes at least one of the following:
selecting the basic structure or the shape and the size dimensions of the basic structure in consideration of at least one of the following criteria:
level of a load to be expected,
type of a load to be expected,
desired or predetermined deformation path, and
influence from the environment on the component or the surface; and
forming the basic structure with a period succession of recesses and projections.

7. The coating method according to claim 1, wherein
the providing includes selecting the first material and the second material such that the second material has at least one of the following
a higher modulus of elasticity than the first material,
a higher hardness than the first material,
a lower breaking elongation, reduction of area at break, and fracture toughness than the first material, and
a lower dynamic strength than the first material.

8. The coating according to claim 7, further comprising providing or forming the first material layer both as first function layer for providing at least a first function or as a mold for formation of the second material layer; and
forming the second material layer as second function layer for providing at least one second function.

9. The coating method according to claim 7, wherein
the structuring of the first material layer includes at least one of the following:
microscopic structuring of the first material layer by an energetic beam, a laser beam, an ion beam or an electron beam;
thermal microscopic structuring by a heated counter-mould; and
microscopic embossing the basic structure on the material layer surface.

10. The coating method according to claim 7, wherein
the structuring of the first material layer includes at least one of the following:

selecting the basic structure or the shape and the size dimensions of the basic structure in consideration of at least one of the following criteria:
  level of a load to be expected,
  type of a load to be expected,
  desired or predetermined deformation path, and
  influence from the environment on the component or the surface; and
forming the basic structure with a period succession of recesses and projections.

11. The coating according to claim 1, further comprising
providing or forming the first material layer both as first function layer for providing at least a first function or as a mold for formation of the second material layer; and
forming the second material layer as second function layer for providing at least one second function.

12. The coating method according to claim 1, further comprising at least one of the following
  providing or forming the first material layer as at least one of the following
    an insulating layer for electric insulation,
    a protective layer for protection from moisture, and
    a resilient buffer layer for resilient balancing of relative displacements or relative movements between the second material layer and the substrate; and
  forming the second material layer as at least one of the following
    a protective layer for protection from chemical loads,
    a protective layer for protection from mechanical or physical loads,
    a protective layer for protection from thermal loads,
    an electrically conductive or electrically insulating function layer, and
    a field-influencing layer for influencing electromagnetic, electric or magnetic fields.

13. The coating method according to claim 1, wherein
the structuring of the first material layer includes at least one of the following:
microscopic structuring of the first material layer by an energetic beam, a laser beam, an ion beam or an electron beam;
thermal microscopic structuring by a heated counter-mould; and
microscopic embossing the basic structure on the material layer surface.

14. The coating method according to claim 1, wherein
the structuring of the first material layer includes at least one of the following:
selecting the basic structure or the shape and the size dimensions of the basic structure in consideration of at least one of the following criteria:
  level of a load to be expected,
  type of a load to be expected,
  desired or predetermined deformation path, and
  influence from the environment on the component or the surface; and
forming the basic structure with a period succession of recesses and projections.

15. The coating method according to claim 1, wherein
the first material has a thickness in a range of 1 µm to 50 µm; and
the second material has a thickness in a range of 1 µm to 10 µm.

* * * * *